United States Patent
Zhang et al.

(10) Patent No.: US 11,289,531 B2
(45) Date of Patent: Mar. 29, 2022

(54) DETECTION PANEL, MANUFACTURING METHOD THEREOF AND PHOTO DETECTION DEVICE

(71) Applicants: Beijing BOE Sensor Technology Co., Ltd., Beijing (CN); BOE Technology Group Co., Ltd., Beijing (CN)

(72) Inventors: Guan Zhang, Beijing (CN); Jianxing Shang, Beijing (CN)

(73) Assignees: Beijing BOE Sensor Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 66 days.

(21) Appl. No.: 16/837,389

(22) Filed: Apr. 1, 2020

(65) Prior Publication Data
US 2021/0143207 A1    May 13, 2021

(30) Foreign Application Priority Data
Nov. 13, 2019  (CN) .......................... 201911107634.6

(51) Int. Cl.
*H01L 27/146*    (2006.01)
*G01T 1/20*    (2006.01)
(Continued)

(52) U.S. Cl.
CPC ...... *H01L 27/14663* (2013.01); *G01T 1/2018* (2013.01); *H01L 27/14629* (2013.01);
(Continued)

(58) Field of Classification Search
CPC ......... H01L 27/14663; H01L 27/14629; H01L 27/14636; H01L 27/14685;
(Continued)

(56) References Cited

U.S. PATENT DOCUMENTS

| 6,236,063 B1* | 5/2001 | Yamazaki ........... G02F 1/13318 |
| | | 257/59 |
| 2001/0000676 A1* | 5/2001 | Zhang ................ H04N 1/02805 |
| | | 349/12 |

(Continued)

FOREIGN PATENT DOCUMENTS

| CN | 104434152 A | 3/2015 |
| CN | 105374889 A | 3/2016 |

(Continued)

OTHER PUBLICATIONS

Office Action for corresponding Chinese application No. 201911107634.6 dated Aug. 24, 2021.

*Primary Examiner* — Bitew A Dinke
(74) *Attorney, Agent, or Firm* — Arent Fox LLP; Michael Fainberg (57) ABSTRACT

A detection panel, a manufacturing method thereof and a photo detection device are provided. The detection panel includes a plurality of detection pixel units in an array, the detection pixel unit includes a reflective structure on a base substrate, a detection circuit and a photoelectric conversion structure on the reflective structure; the photoelectric conversion structure includes a first electrode, a photodiode and a second electrode stacked sequentially, and the first electrode is electrically connected with the detection circuit, and the first electrode is an optically transparent electrode, and an orthographic projection of the reflective structure on the base substrate at least covers an orthographic projection of the photodiode on the base substrate.

13 Claims, 7 Drawing Sheets

(51) Int. Cl.
*H01L 31/0224* (2006.01)
*H01L 31/105* (2006.01)

(52) U.S. Cl.
CPC .. *H01L 27/14636* (2013.01); *H01L 27/14685* (2013.01); *H01L 31/022475* (2013.01); *H01L 31/105* (2013.01)

(58) Field of Classification Search
CPC ....... H01L 31/022475; H01L 27/14692; H01L 27/14683; H01L 27/14643; H01L 31/105–107; G01T 1/2018
See application file for complete search history.

(56) References Cited

U.S. PATENT DOCUMENTS

| | | | | |
|---|---|---|---|---|
| 2008/0099664 | A1* | 5/2008 | Yamazaki | H01L 31/02327 250/214 A |
| 2012/0267539 | A1* | 10/2012 | Shinba | H01L 31/02322 250/366 |
| 2013/0161772 | A1* | 6/2013 | Chan | H01L 27/14663 257/428 |
| 2015/0085978 | A1 | 3/2015 | Massetti et al. | |
| 2015/0270299 | A1* | 9/2015 | Gao | H01L 27/1274 257/72 |
| 2015/0340511 | A1* | 11/2015 | Yan | H01L 29/66969 257/43 |
| 2015/0369661 | A1* | 12/2015 | Lin | G06K 9/0004 250/227.11 |
| 2016/0049528 | A1 | 2/2016 | Cho et al. | |
| 2016/0224819 | A1* | 8/2016 | Kim | G06K 9/0004 |
| 2017/0035359 | A1* | 2/2017 | Qiu | A61B 5/6887 |
| 2019/0115377 | A1* | 4/2019 | Huang | H05G 1/10 |
| 2019/0229146 | A1 | 7/2019 | Wu | |
| 2020/0143136 | A1* | 5/2020 | Huang | G06K 9/0004 |
| 2020/0205072 | A1* | 6/2020 | Huang | H04W 52/027 |
| 2020/0400843 | A1* | 12/2020 | Imai | G01T 1/2006 |
| 2021/0167143 | A1* | 6/2021 | He | H01L 27/3258 |
| 2021/0193752 | A1* | 6/2021 | Wang | H01L 27/3262 |
| 2021/0217784 | A1* | 7/2021 | Li | H01L 27/3262 |

FOREIGN PATENT DOCUMENTS

| | | | | |
|---|---|---|---|---|
| CN | 107799539 | A | | 3/2018 |
| CN | 108878572 | A * | | 11/2018 |
| CN | 109786470 | A * | 5/2019 | ............. H01L 27/32 |
| CN | 109863509 | A | | 6/2019 |
| CN | 110299380 | A * | 10/2019 | ........... G06F 3/0412 |

* cited by examiner

Fig. 8

DETECTION PANEL, MANUFACTURING METHOD THEREOF AND PHOTO DETECTION DEVICE

CROSS-REFERENCES TO RELATED APPLICATION

This application claims priority to Chinese patent application No. 201911107634.6 filed on Nov. 13, 2019, which is incorporated herein by reference in its entirety.

FIELD

The present disclosure relates to the technical field of detection panels, and particularly to a detection panel, a manufacturing method thereof and a photo detection device.

BACKGROUND

The Flat X-ray panel detector (FPXD) manufactured based on a thin film transistor (TFT) technology is a crucial element in a digital image technology. Since such detectors have the advantages such as high imaging speed, good spatial and density resolution, high signal-to-noise ratio, and direct digital output, they are widely used in the fields including medical imaging (such as chest X-rays), industrial detection (such as metal flaw detection), security testing, air transportation and the like.

SUMMARY

In one aspect, an embodiment of the present disclosure provides a detection panel. The detection panel includes a plurality of detection pixel units in an array, each of the detection pixel units includes a reflective structure on a base substrate, a detection circuit and a photoelectric conversion structure on the reflective structure; wherein the photoelectric conversion structure includes a first electrode, a photodiode and a second electrode stacked sequentially, and the first electrode is electrically connected with the detection circuit; and wherein the first electrode is an optically transparent electrode, and an orthographic projection of the reflective structure on the base substrate at least covers an orthographic projection of the photodiode on the base substrate.

Optionally, in implementation, in the detection panel according to the embodiment of the present disclosure, the orthographic projection of the reflective structure on the base substrate completely covers an orthographic projection of the corresponding detection pixel unit on the base substrate.

Optionally, in implementation, in the detection panel according to the embodiment of the present disclosure, the reflective structure is a planar reflective structure.

Optionally, in implementation, in the detection panel according to the embodiment of the present disclosure, the reflective structure is a concave reflective structure which protrudes towards the base substrate, the base substrate is provided with a groove structure on a side thereof facing the concave reflective structure, and the concave reflective structure is adhered to the groove structure.

Optionally, in implementation, the detection panel according to the embodiment of the present disclosure further includes a planarization layer between the concave reflective structure and the detection circuit, and a material of the planarization layer is resin.

Optionally, in implementation, in the detection panel according to the embodiment of the present disclosure, the base substrate is a flexible base substrate.

Optionally, in implementation, in the detection panel according to the embodiment of the present disclosure, a material of the first electrode is translucent conductive material or transparent conductive material.

Optionally, in implementation, in the detection panel according to the embodiment of the present disclosure, the translucent conductive material includes any one or a combination of graphene and metal nanoparticle, and the transparent conductive material is ITO.

Optionally, in implementation, the detection panel according to the embodiment of the present disclosure further includes a bias voltage layer on the second electrode, the bias voltage layer is electrically connected with the second electrode.

Optionally, in implementation, the detection panel according to the embodiment of the present disclosure further includes a scintillator layer on the bias voltage layer, the scintillator layer is configured to convert a radiation signal into a visible light signal.

Optionally, in implementation, in the detection panel according to the embodiment of the present disclosure, the photodiode is a PIN photodiode.

In another aspect, an embodiment of the present disclosure provides a photo detection device, including any the detection panel according to the above embodiments of the present disclosure.

In another aspect, an embodiment of the present disclosure provides a manufacturing method of any of the detection panel according to the above embodiment of the present disclosure. The manufacturing method includes: forming a reflective structure on a base substrate in each detection pixel unit; forming a detection circuit on the reflective structure; and forming a first electrode, a photodiode and a second electrode stacked sequentially on the reflective structure to form a photoelectric conversion structure, wherein the first electrode is electrically connected with the detection circuit, the first electrode is an optically transparent electrode, and an orthographic projection of the reflective structure on the base substrate at least covers an orthographic projection of the photodiode on the base substrate.

Optionally, in implementation, in the manufacturing method according to the embodiment of the present disclosure, forming the reflective structure on the base substrate in each detection pixel unit, includes: fabricating a groove structure on a surface of a flexible base substrate in each detection pixel unit by using an etching or nano-imprinting process; and evaporating metal material onto one side of the flexible base substrate with the groove structure, to form a concave reflective structure within the groove structure.

Optionally, in implementation, the manufacturing method according to the embodiment of the present disclosure, after forming the concave reflective structure and before forming the detection circuit, further including: forming a planarization layer on the base substrate with the concave reflective structure.

DETAILED DESCRIPTION

In order to make the objects, technical solutions and advantages of the present disclosure clearer, implementations of a detection panel, a manufacturing method thereof and a detection device provided by the embodiments of the present disclosure are described in detail below in combination with accompanying drawings.

The thickness and shape of each film layer in the accompanying drawings are only intended to schematically describe the content of the disclosure, rather than to reflect the true proportion of the detection panel.

The related FPXD usually includes a detection panel for X-ray detection. Each detection panel includes a plurality of detection pixel units. In the detection pixel units, photo detection readout circuits are set to convert optical signals into electrical signals and output them.

Improvement of the visible light utilization of FPXD pixels is an important technical direction to improve the image signal-to-noise ratio and reduce the X-ray radiation dose. At present, the main trend of pixel design improvement is to increase the filling rate of photodiodes in pixels to further increase the photosensitive area. But in fact, under the premise of the certain filling rate of photodiodes in pixels, about 10%-20% visible light may penetrate a pixel plane through gaps between the photodiodes and surrounding arranged wires, and then pass through a transparent TFT substrate and lose. Therefore, it is necessary to effectively utilize the visible light in this part to improve the existing pixel sensitivity level.

The embodiments of the present disclosure provide a detection panel, a manufacturing method thereof and a detection device to solve the problem of reducing pixel sensitivity in the related art due to the visible light's loss when visible light passes through a pixel plane through gaps between photodiodes and surrounding arranged wires, and then passes through a transparent TFT substrate.

Figure 1:
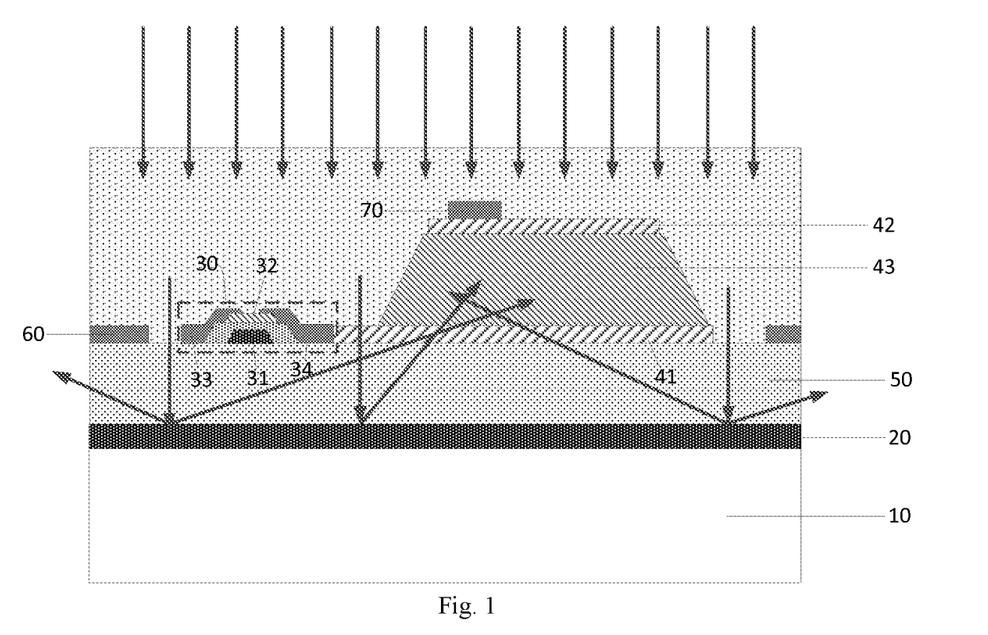
FIG. 1 is a schematic structural diagram of a detection panel according to an embodiment of the present disclosure.
Figure 2:
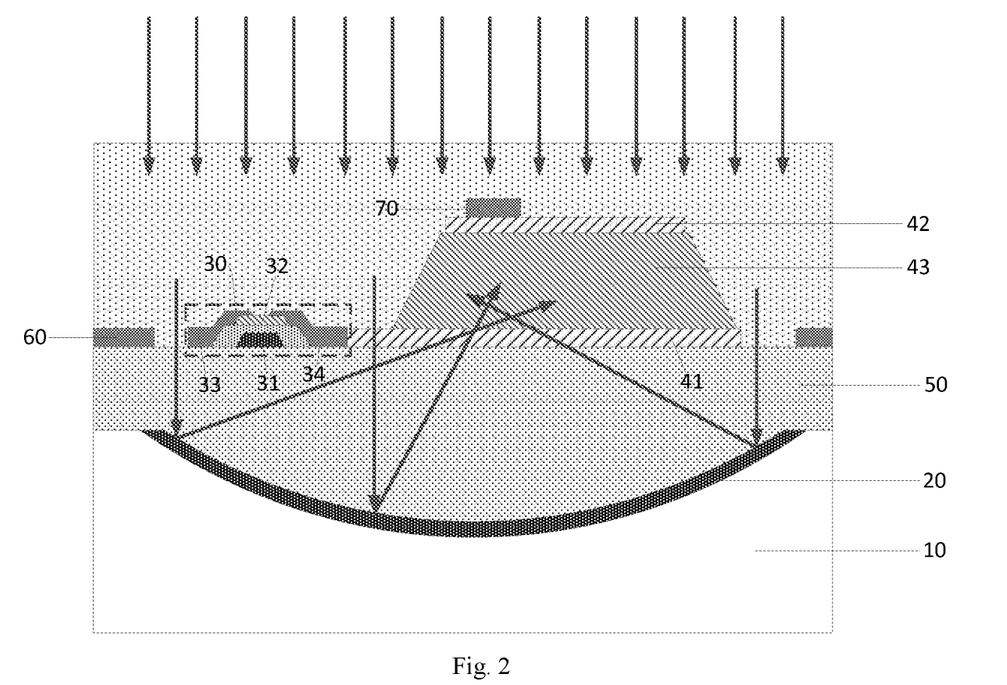
FIG. 2 is a schematic structural diagram of another detection panel according to an embodiment of the present disclosure.

The embodiment of the present disclosure provides a detection panel, including a plurality of detection pixel units distributed in an array. As shown in FIG. 1 and FIG. 2, each detection pixel unit includes a reflective structure 20 on a base substrate 10, a detection circuit 30 and a photoelectric conversion structure on the reflective structure 20.

The photoelectric conversion structure includes a first electrode 41, a photodiode 43 and a second electrode 42 stacked sequentially, and the first electrode 41 is electrically connected with the detection circuit 30; wherein the first electrode 41 is an optically transparent electrode, and an orthographic projection of the reflective structure 20 on the base substrate 10 at least covers an orthographic projection of the photodiode 43 on the base substrate 10.

In the detection panel according to the embodiment of the present disclosure, the reflective structure 20 is arranged between the base substrate 10 and the detection circuit 30 in each detection pixel unit, so that the reflective structure 20 may reflect the visible light penetrating the pixel plane through the gaps between the photodiode 43 and the surrounding arranged wires (such as data lines 60) to a photodiode 43 region when the visible light (as shown by the arrows) enters the detection pixel unit. Since the first electrode 41 in the photoelectric conversion structure is an optically transparent electrode, the visible light reflected back to the photodiode 43 region can be absorbed by the photodiode 43 again so that the visible light penetrating the pixel plane through the gaps between the photodiode 43 and the surrounding arranged wires may be used effectively, thereby significantly improving the photoelectric effect sensitivity of the pixels on the premise of not affecting the resolution, and significantly improving the pixel sensitivity level.

It should be noted that FIG. 1 and FIG. 2 just schematically show that there are gaps between the photodiodes and the surrounding detection circuits 30 as well as between the photodiodes and the surrounding wires (such as the data lines 60) in the detection panel so that the visible light (as shown by the arrows) may pass through the gaps and penetrate the detection pixel units. FIG. 1 schematically shows that the first electrode 41 and the drain electrode 34 of thin film transistor in the detection circuit 30 are in the same layer. The first electrode 41 is electrically connected with the drain electrode 34 of thin film transistor in the detection circuit 30.

In some embodiments, in order to avoid the influence of forming source-drain of the transistor on the subsequent first electrode, the photoelectric conversion structure and the detection circuit 30 are arranged in different layers and the photoelectric conversion structure is located on the detection circuit 30. In specific implementation, the first electrode 41 of the photoelectric conversion structure is on the drain electrode 34 and the first electrode 41 is electrically connected with the drain electrode 34 through via hole running through an insulation layer. The structures of various film layers of the detection circuit 30 and the photoelectric conversion structure in the detection panel according to the embodiment of the present disclosure are the same as those in the related art. The differences between the present disclosure and the related art are that the reflective structure 20 is arranged between the detection circuit 30 and the base substrate and the first electrode 41 is set as the optically transparent electrode.

In some embodiments, in the above detection panel according to the embodiment of the present disclosure, as shown in FIG. 1 and FIG. 2, the detection circuit 30 includes a thin film transistor, the thin film transistor includes a gate 31, an active layer 32, a source 33 and a drain 34 which are stacked sequentially on the base substrate 10. The material of the active layer 32 may be semiconductor material such as amorphous silicon, polysilicon or IGZO. The source 33 and the drain 34 are configured to transmit electrical signals of data line and pixel electrode.

In some embodiments, the above detection panel according to the embodiment of the present disclosure, as shown in FIG. 1 and FIG. 2, further includes a bias voltage layer 70, wherein the second electrode 42 is electrically connected with the bias voltage layer 70. The first electrode 41 is configured to conduct the electrical signal formed by the photodiode 43 after being irradiated by the visible light. When it is working, 5-10 V voltage is added to the second electrode 42 by, for example, the bias voltage layer 70, thus the photodiode 43 works under negative bias voltage, the photodiode 43 generates the different electrical signals, and these electrical signals are stored in the first electrode 41. The electrical signals stored in the first electrode 41 are transmitted to an external IC via the detection circuit 30 so as to save the image data.

Figure 3:
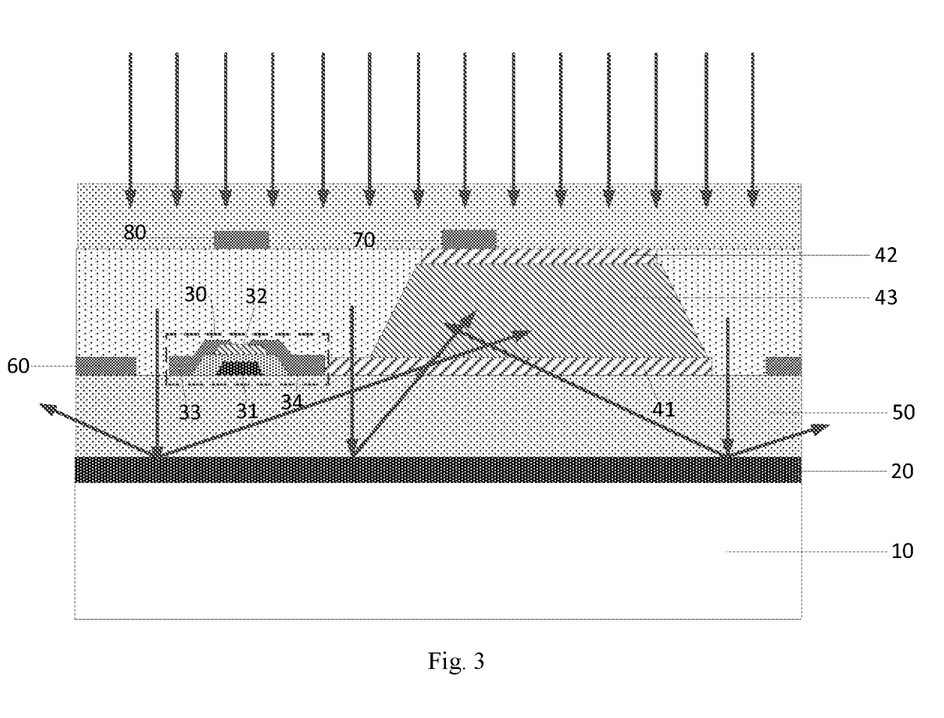
FIG. 3 is a schematic structural diagram of another detection panel according to an embodiment of the present disclosure.
Figure 4:
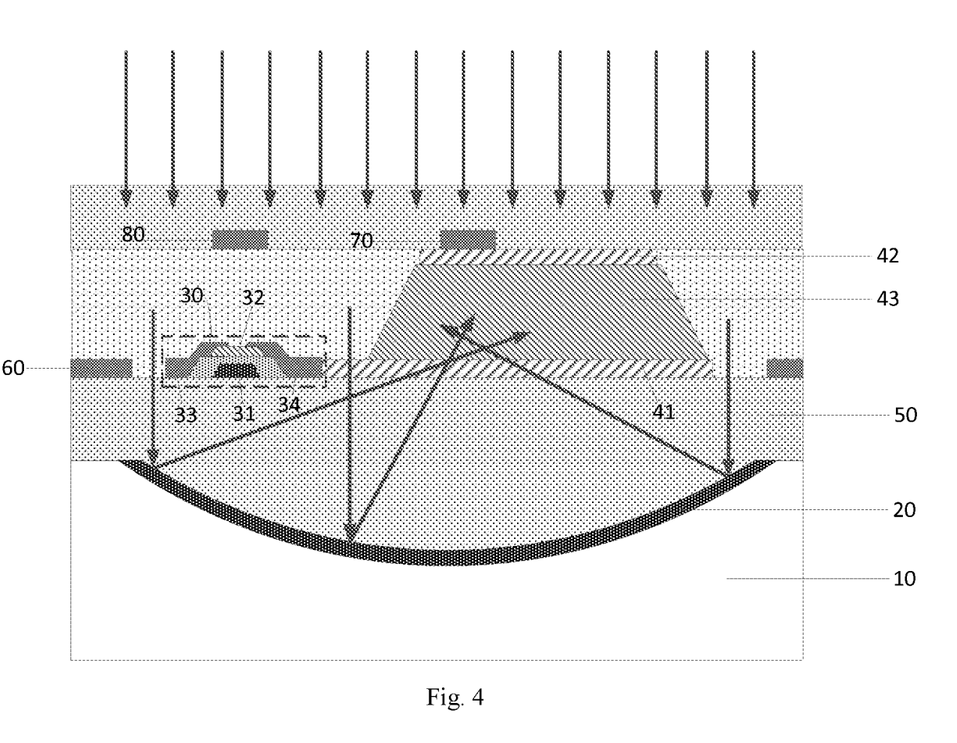
FIG. 4 is a schematic structural diagram of still another detection panel according to an embodiment of the present disclosure.

In some embodiments, in the above detection panel according to the embodiment of the present disclosure, as shown in FIG. 3 and FIG. 4, the detection panel further includes a protection layer and a planarization layer (not shown) on the thin film transistor 30. The material of the protection layer may be silicon nitride. The material of the planarization may be resin. The detection panel further includes a black matrix 80, the black matrix 80 is located on the planarization layer, and in the same layer as the bias voltage layer 70.

In some embodiments, in the detection panel according to the embodiment of the present disclosure, the photodiode is a PIN photodiode. Specifically, the PIN photodiode includes a P-type region, an N-type region and an intrinsic region between the P-type region and the N-type region, which are stacked sequentially on the base substrate.

In some embodiments, the detection panel further includes a scintillator layer on the bias voltage layer (not shown in the drawings). Specifically, the scintillator layer is configured to convert radiation signal into the visible light signal and may be formed by any appropriate scintillation material. In some embodiments, the scintillation material is the optical wavelength conversion material that can convert radiation (e.g., X-rays) into the visible light. The scintillation material may include but is not limited to cesium iodide activated by thallium, or cesium iodide activated by sodium, wherein cesium iodide is a light-sensitive material.

In some embodiments, in order to effectively utilize all the visible light penetrating the pixel plane through the gaps between the photodiodes and the surrounding arranged wires, in the above detection panel according to the embodiment of the present disclosure, as shown in FIG. 1 and FIG. 2, the orthogonal projection of the reflective structure 20 on the base substrate 10 completely covers the orthographic projection of the corresponding detection pixel unit on the base substrate 10.

In some embodiments, in the detection panel according to the embodiment of the present disclosure, as shown in FIG. 1, the reflective structure 20 may be a planar reflective structure. The planar reflective structure arranged between the base substrate 10 and the detection circuit 30 may effectively reflect the visible light back to the photodiode 43. In implementation, the visible light entered into the detection pixel unit is converted by the scintillator layer, but not all of the visible light perpendicularly enters into the pixel plane, and there is part of the inclined visible light. Thus the inclined visible light will have certain transverse offset after being reflected, and then enter into adjacent detection pixel unit regions (as shown by the reflective arrows on the left and right sides in FIG. 1), thereby causing resolution loss of images.

Due to the problem that the above reflective structure is the planar reflective structure and may not reflect the inclined visible light back to the corresponding photodiode, in the above detection panel according to the embodiment of the present disclosure, in order to reflect the visible light completely back to the photodiode, as shown in FIG. 2, the reflective structure 20 is a concave reflective structure 20 which protrudes towards the base substrate 10, the base substrate 10 is provided with a groove structure on a side thereof facing the concave reflective structure 20, and the concave reflective structure 20 is adhered to the groove structure. Specifically, the concave reflective structure 20 may be a concave mirror, so that the reflective structure 20 may reflect using the concave mirror. The adjustment of the geometric shape may make reflective focuses be located at effective absorption layer of the corresponding photodiode 43 while ensuring that the vast majority of the non-vertical incoming light (inclined visible light) may be limited in the same detection pixel unit region after it is being reflected, thereby reducing the interference in the adjacent detection pixel units, further improving the pixel sensitivity level.

Optionally, in implementation, since the concave reflective structures are not flat, if other layer structures of the detection panel are formed directly on the concave reflective structures, film layer fracture will happen because the thickness of each film layer is relatively thin. Hence, the detection panel according to the embodiment of the present disclosure, as shown in FIG. 2, further includes a planarization layer 50 between the concave reflective structure 20 and the detection circuit 30. In order to ensure that the visible light penetrating from the gaps can pass through the planarization layer 50 and to increase the direct adhesion between the subsequent film layer structures and the base substrate 10, the material of the planarization layer 50 may be resin.

In some embodiments, in the detection panel according to the embodiment of the present disclosure, as shown in FIG. 1, in order to increase the direct adhesion between the subsequent film layer structures and the base substrate 10, the detection panel further includes a planarization layer 50 between the concave reflective structure 20 and the detection circuit 30. The material of the planarization layer 50 may be resin.

In some embodiments, in the above detection panel according to the embodiment of the present disclosure, as shown in FIG. 1 and FIG. 2, the base substrate 10 may be a flexible base substrate. On the one hand, as shown in FIG. 2, the base substrate 10 is a flexible base substrate, wherein a groove structure is formed on the surface of the flexible base substrate in each of the detection pixel units by using an etching or nano-imprinting process, and the metal material is evaporated onto one side of the flexible base substrate with the groove structure to form the concave reflective structure within the groove structure. Such manufacturing process is simple and easy to implement. On the other hand, the application range of the detection panel such as the field of flexibility can be expanded.

In some embodiments, in the above detection panel according to the embodiment of the present disclosure, as shown in FIG. 1 and FIG. 2, the material of the first electrode 41 may be either translucent conductive material or transparent conductive material.

In some embodiments, in the above detection panel according to the embodiment of the present disclosure, when the material of the first electrode is the translucent conductive material, the translucent conductive material includes any one or a combination of graphene and metal nanoparticle. When the material of the first electrode is the transparent conductive material, the transparent conductive material is ITO. Of course, in implementation, the translucent conductive material or transparent conductive material is not limited to the materials as listed in the present disclosure, and may also be selected from other translucent conductive materials or transparent conductive materials, but no limitation will be made herein.

Figure 5:
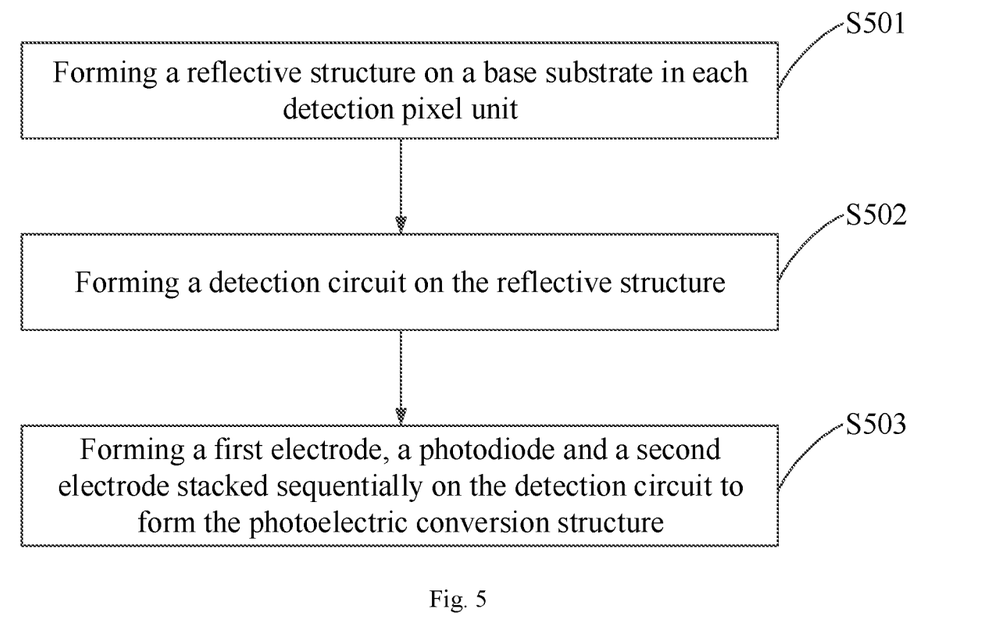
FIG. 5 is a first flow chart of a manufacturing method of a detection panel according to an embodiment of the present disclosure.

Based on the same inventive concept, the embodiment of the present disclosure also provides a manufacturing method of the detection panel. As shown in FIG. 5, the manufacturing method includes the following steps.

S501 is to form a reflective structure on the base substrate in each detection pixel units.

S502 is to form a detection circuit on the reflective structure.

S503 is to form a first electrode, a photodiode and a second electrode stacked sequentially on the detection circuit to form the photoelectric conversion structure, wherein the first electrode is electrically connected with the detection circuit, the first electrode is an the optically transparent electrode, and the orthographic projection of the reflective structure on the base substrate at least covers the orthographic projection of the photoelectric conversion structure on the base substrate.

The embodiment of the present disclosure provides the manufacturing method of the above detection panel, the reflective structure is arranged between the base substrate and the detection circuit of each detection pixel unit, so that the reflective structure may reflect the visible light penetrating the pixel plane through the gaps between the photodiode and the surrounding arranged wires to the photodiode region when the visible light enters the detection pixel unit. Since the first electrodes in the photoelectric conversion structures are the optically transparent electrodes, the visible light reflected back to the photodiode regions can be absorbed by the photodiodes again so that the visible light penetrating the pixel plane through the gaps between the photodiodes and the surrounding arranged wires may be used effectively, thereby significantly improving the current pixel sensitivity level.

Figure 6:
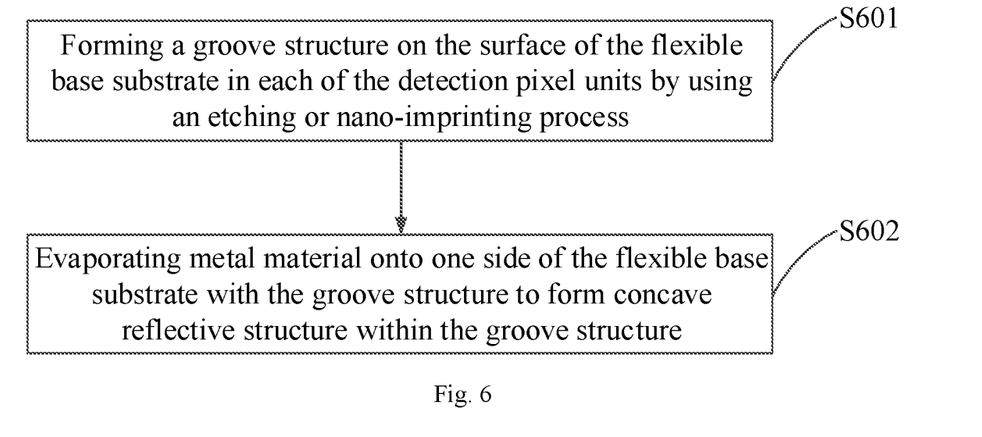
FIG. 6 is a second flow chart of a manufacturing method of a detection panel according to an embodiment of the present disclosure.

In some embodiments, the manufacturing method of the detection panel according to the embodiment of the present disclosure, as shown in FIG. 6, the reflective structure is formed on the base substrate in each detection pixel unit by the following steps.

S601 is to form a groove structure on the surface of the flexible base substrate in each of the detection pixel units by using an etching or nano-imprinting process.

S602 is to evaporate metal material onto one side of the flexible base substrate with the groove structure, to form the concave reflective structure within the groove structure. In some embodiments, in the manufacturing method of the detection panel according to the embodiment of the present disclosure, after forming the concave reflective structure and before forming the detection circuit, the method further includes: forming a planarization layer on the base substrate with the concave reflective structure.

The following is a detailed description of the manufacturing method of the detection panel as shown in FIG. 2 through specific embodiments.

Figure 7A:
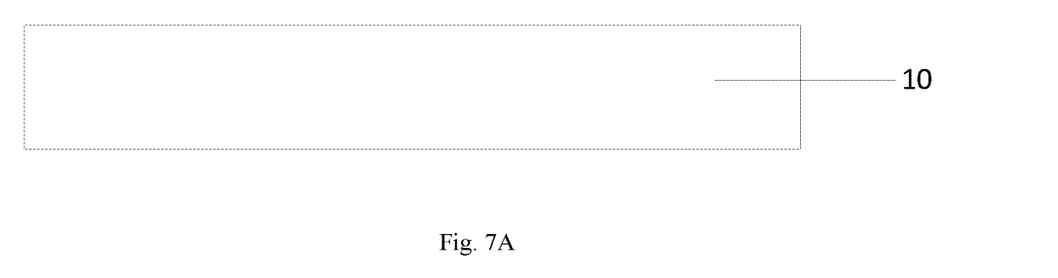
FIG. 7A to FIG. 7D are profile structural diagrams of the detection panel according to the embodiment of the present disclosure after each step is performed.

(1) The flexible base substrate 10 is provided, as shown in FIG. 7A.

Figure 7B:
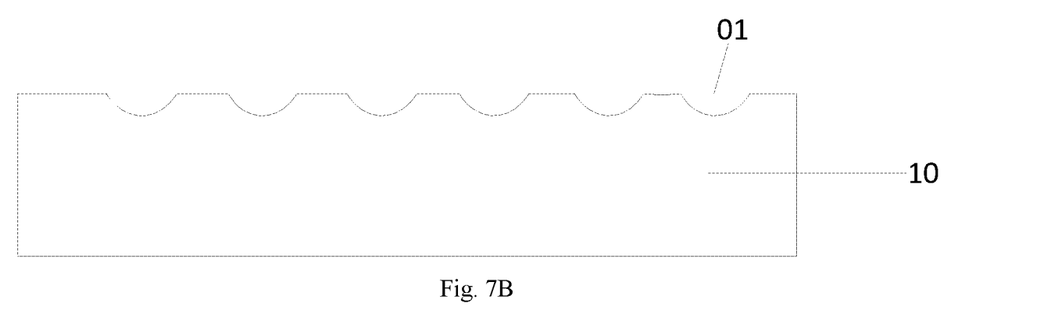

(2) The groove structure 01 is formed on the surface of the flexible base substrate 10 in each of the detection pixel units by using the etching or nano-imprinting process, as shown in FIG. 7B.

Figure 7C:
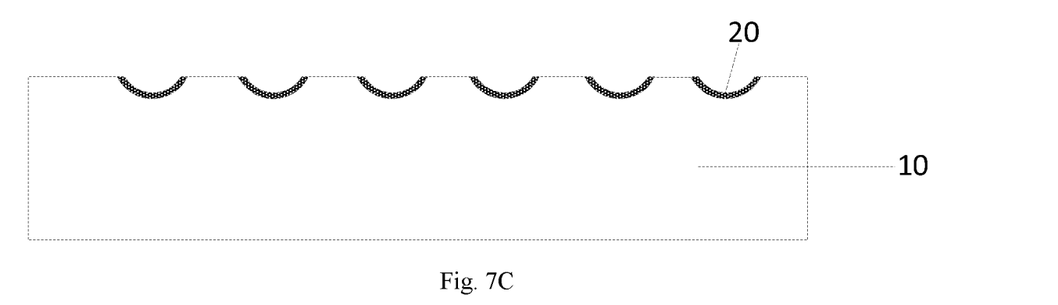

(3) The metal material is evaporated onto one side of the flexible base substrate 10 with the groove structures 01 to form the concave reflective structures 20 within the groove structures, as shown in FIG. 7C.

Figure 7D:
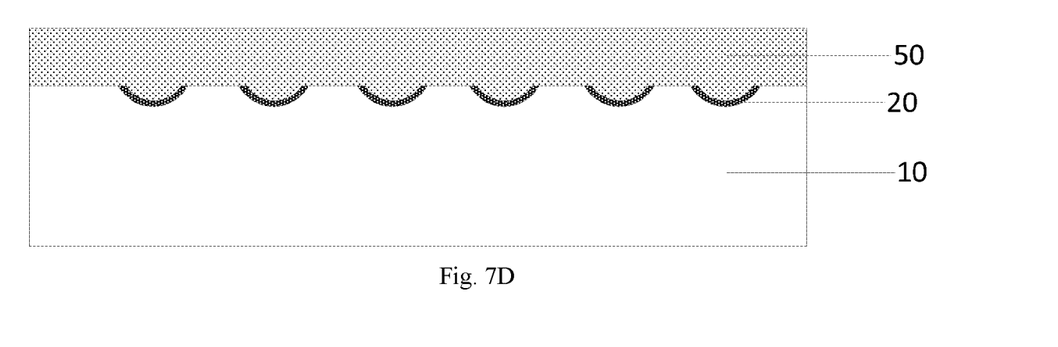

(4) The planarization layer 50 is formed on the base substrate 10 with the concave reflective structures 20, as shown in FIG. 7D.

(5) The photo detection circuits 30 and the photoelectric conversion structures are formed on the planarization layer 50, in which the first electrodes of the photoelectric conversion structures are the optically transparent electrodes, as shown in FIG. 2.

The detection panel shown in FIG. 2 provided by the embodiment of the present disclosure may be obtained after the above steps (1) to (5) of Example 1.

Figure 8:
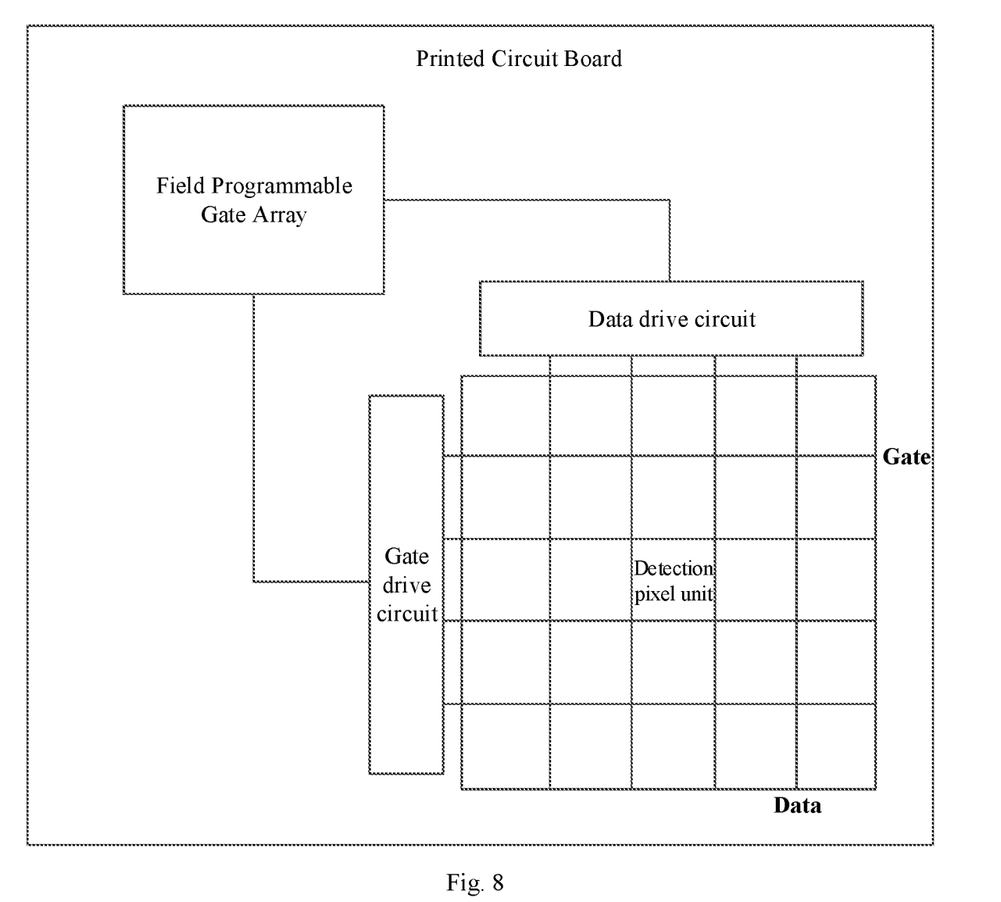
FIG. 8 is a schematic structural diagram of a photo detection device according to an embodiment of the present disclosure.

Based on the same inventive concept, the embodiment of the present disclosure also provides a photo detection device, including one of the above detection panels provided by the embodiment of the present disclosure. Specifically, as shown in FIG. 8, the photo detection device includes any of the above detection panels, wherein the detection panel includes the plurality of detection pixel units in an array, and the photo detection device further includes a gate drive circuit electrically connected with the gate lines corresponding to the detection pixel units, a data drive circuit electrically connected with the data lines corresponding to the detection pixel units, and a field programmable gate array (FPGA) electrically connected with the gate drive circuit and the data drive circuit, wherein the gate drive circuit, the data drive circuit and the FPGA are formed on printed circuit boards (PCBs). The principle of the photo detection device to solve the problem is similar to the aforementioned detection panel, so the implementation of the photo detection device can be referred to the implementation of the aforementioned detection panel. And no repetition will be made herein.

The embodiment of the present disclosure provides the detection panel, the manufacturing method thereof and the photo detection device. The detection panel includes the plurality of detection pixel units in an array, each detection pixel unit includes a reflective structure on the base substrate, a detection circuit and a photoelectric conversion structure on the reflective structure; the photoelectric conversion structure includes a first electrode, a photodiode and a second electrode stacked sequentially, and the first electrode is electrically connected with the detection circuit, wherein the first electrode is an optically transparent electrode, and the orthographic projection of the reflective structure on the base substrate at least covers the orthographic projection of the photoelectric conversion structure on the base substrate. In the present disclosure, the reflective structure is arranged between the base substrate and the detection circuit of each detection pixel unit, so that the reflective structure may reflect the visible light penetrating the pixel plane through the gaps between the photodiode and the surrounding arranged wires to the photodiode region when the visible light enters the detection pixel unit. Since the first electrodes in the photoelectric conversion structures are the optically transparent electrodes, the visible light reflected back to the photodiode regions can be absorbed by the photodiodes again so that the visible light penetrating the pixel plane through the gaps between the photodiodes and the surrounding arranged wires may be used effectively, thereby significantly improving the photoelectric effect sensitivity of the pixels on the premise of not affecting the resolution, and significantly improving the current pixel sensitivity level.

Evidently those skilled in the art can make various modifications and variations to the invention without departing from the spirit and scope of the invention. Thus the invention is also intended to encompass these modifications and variations therein as long as these modifications and variations come into the scope of the claims of the invention and their equivalents.

The invention claimed is:

1. A detection panel, comprising:
a plurality of detection pixel units in an array, wherein each of the detection pixel units comprises a reflective structure on a base substrate, a detection circuit and a photoelectric conversion structure on the reflective structure;
wherein the photoelectric conversion structure comprises a first electrode, a photodiode and a second electrode stacked sequentially, and the first electrode is electrically connected with the detection circuit, and
wherein the first electrode is an optically transparent electrode, and an orthographic projection of the reflective structure on the base substrate at least covers an orthographic projection of the photodiode on the base substrate; and
the reflective structure is a concave reflective structure which protrudes towards the base substrate, the base substrate is provided with a groove structure on a side thereof facing the concave reflective structure, and the concave reflective structure is adhered to the groove structure.

2. The detection panel according to claim 1, wherein the orthographic projection of the reflective structure on the base substrate completely covers an orthographic projection of the corresponding detection pixel unit on the base substrate.

3. The detection panel according to claim 1, further comprising: a planarization layer between the concave reflective structure and the detection circuit, and a material of the planarization layer is resin.

4. The detection panel according to claim 1, wherein the base substrate is a flexible base substrate.

5. The detection panel according to claim 1, wherein a material of the first electrode is translucent conductive material or transparent conductive material.

6. The detection panel according to claim 5, wherein the translucent conductive material comprises any one or a combination of graphene and metal nanoparticle, and the transparent conductive material is ITO.

7. The detection panel according to claim 1, further comprising: a bias voltage layer on the second electrode, the bias voltage layer is electrically connected with the second electrode.

8. The detection panel according to claim 7, further comprising: a scintillator layer on the bias voltage layer, the scintillator layer is configured to convert a radiation signal into a visible light signal.

9. The detection panel according to claim 1, wherein the photodiode is a PIN photodiode.

10. A photo detection device, comprising the detection panel according to claim 1.

11. A manufacturing method of the detection panel according to claim 1, comprising:
forming a reflective structure on a base substrate in each detection pixel unit;
forming a detection circuit on the reflective structure; and
forming a first electrode, a photodiode and a second electrode stacked sequentially on the reflective structure to form a photoelectric conversion structure, wherein the first electrode is electrically connected with the detection circuit, the first electrode is an optically transparent electrode, and an orthographic projection of the reflective structure on the base substrate at least covers an orthographic projection of the photodiode on the base substrate.

12. The manufacturing method according to claim 11, wherein forming the reflective structure on the base substrate in each detection pixel unit, comprising:
fabricating a groove structure on a surface of a flexible base substrate in each detection pixel unit by using an etching or nano-imprinting process;
evaporating metal material onto one side of the flexible base substrate with the groove structure, to form a concave reflective structure within the groove structure.

13. The manufacturing method according to claim 12, wherein after forming the concave reflective structure and before forming the detection circuit, the method further comprising:
forming a planarization layer on the base substrate with the concave reflective structure.

* * * * *